(12) United States Patent
Moribe et al.

(10) Patent No.: US 7,301,412 B2
(45) Date of Patent: Nov. 27, 2007

(54) VARIABLE CAPACITY CIRCUIT AND CONTROL METHOD OF VARIABLE CAPACITY CIRCUIT

(75) Inventors: Tsuyoshi Moribe, Kasugai (JP); Masaki Kishi, Kasugai (JP); Yoshiharu Kamiya, Kasugai (JP); Masahiro Yamamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 18 days.

(21) Appl. No.: 11/216,000

(22) Filed: Sep. 1, 2005

(65) Prior Publication Data

US 2006/0220755 A1 Oct. 5, 2006

(30) Foreign Application Priority Data

Mar. 29, 2005 (JP) ............................. 2005-095482

(51) Int. Cl.
*H03B 5/12* (2006.01)
(52) U.S. Cl. .................. 331/177 V; 331/117 R; 331/167
(58) Field of Classification Search ............ 331/117 R, 331/177 V, 167
See application file for complete search history.

(56) References Cited

U.S. PATENT DOCUMENTS 6,292,065 B1 * 9/2001 Friedman et al. ........ 331/117 R
7,026,883 B2 * 4/2006 Muthali et al. ............. 331/183

FOREIGN PATENT DOCUMENTS

| JP | 11-168355 A | 6/1999 |
| JP | 2002-290152 A | 10/2002 |
| JP | 2004-056720 A | 2/2004 |

* cited by examiner

*Primary Examiner*—Joseph Chang
(74) *Attorney, Agent, or Firm*—Arent Fox, LLP

(57) ABSTRACT

To present a variable capacity circuit and a control method of variable capacity capable of extending a variable capacity width of a variable capacity element to a maximum extent without increasing an element area of the variable capacity element or varying the level of control voltage, a variable capacity circuit 2 comprises a capacity value control circuit 11, varactors VA1 and VA2, and resistance elements R1 and R2. The capacity value control circuit 11 issues a variable output voltage CNTOUT depending on input control voltage VT, and controls the potentials at both ends of the varactors simultaneously. The output voltage CNTOUT is variably adjusted so as to have a negative correlation to the control voltage VT. Variable width of terminal voltage VD can be extended from a variable width SA1 to a variable width SA1a (range is +/−(Vcc1)). As a result, as shown in FIG. 5B, the changeable area of a varactor capacity value CV can be extended from a changeable area CA1 to a changeable area CA1a.

11 Claims, 13 Drawing Sheets

CIRCUIT DIAGRAM OF VOLTAGE CONTROL OSCILLATION CIRCUIT 10

CIRCUIT DIAGRAM OF VOLTAGE CONTROL OSCILLATION CIRCUIT 10

CONFIGURATION EXAMPLE OF VARACTORS VA1 AND VA2

CHARACTERISTIC CURVE OF TERMINAL VOLTAGE VD - VARACTOR CAPACITY VALUE IN VARACTORS VA1 AND VA2

IDEAL CHARACTERISTIC CURVE OF TERMINAL VOLTAGE VD - VARACTOR CAPACITY VALUE CV

CHARACTERISTIC CURVE OF TERMINAL VOLTAGE VD - VARACTOR CAPACITY VALUE CV IN FIRST EMBODIMENT

CORRELATION DIAGRAM OF CONTROL VOLTAGE VT - TERMINAL VOLTAGE VD IN FIRST EMBODIMENT

CORRELATION DIAGRAM OF CONTROL VOLTAGE VT - OSCILLATION FREQUENCY FVCO IN FIRST EMBODIMENT

CIRCUIT DIAGRAM OF CAPACITY CONTROL CIRCUIT 11a

FIG. 9
CHARACTERISTIC CURVE OF TERMINAL VOLTAGE VD - VARACTOR CAPACITY VALUE CV IN SECOND EMBODIMENT
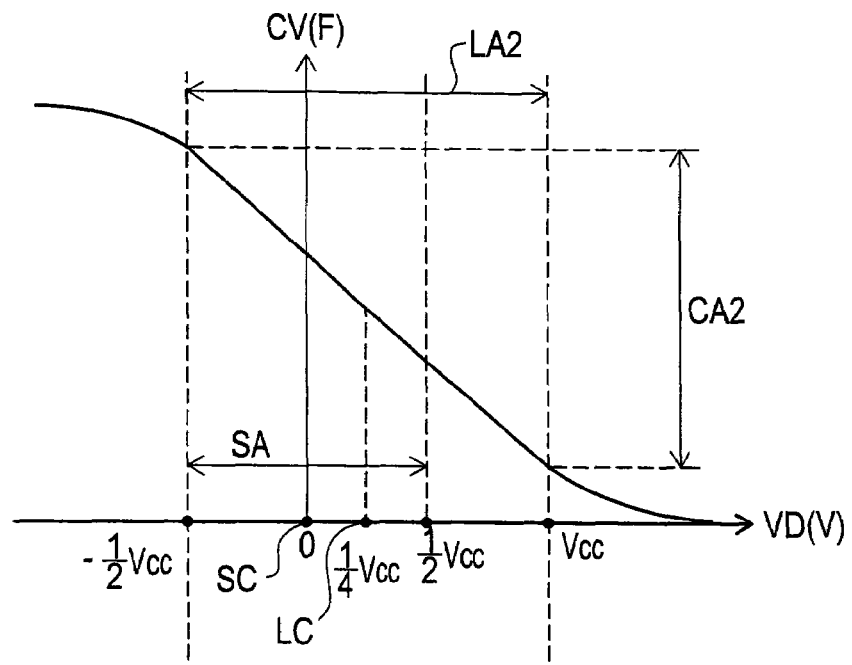
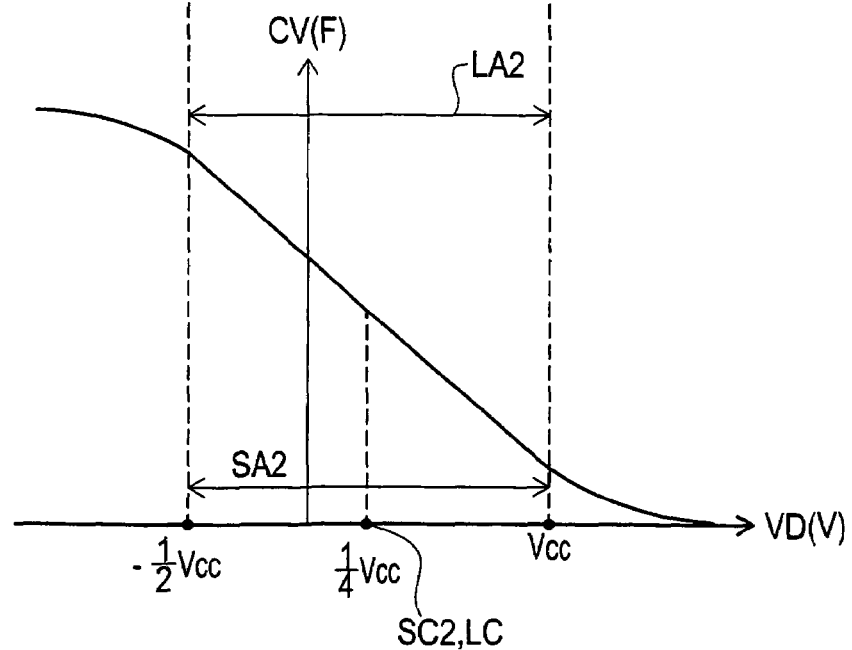

CORRELATION DIAGRAM OF CONTROL VOLTAGE VT - TERMINAL VOLTAGE VD IN SECOND EMBODIMENT

FIG. 11
CHARACTERISTIC CURVE OF TERMINAL VOLTAGE VD - VARACTOR CAPACITY VALUE CV IN THIRD EMBODIMENT
(A)
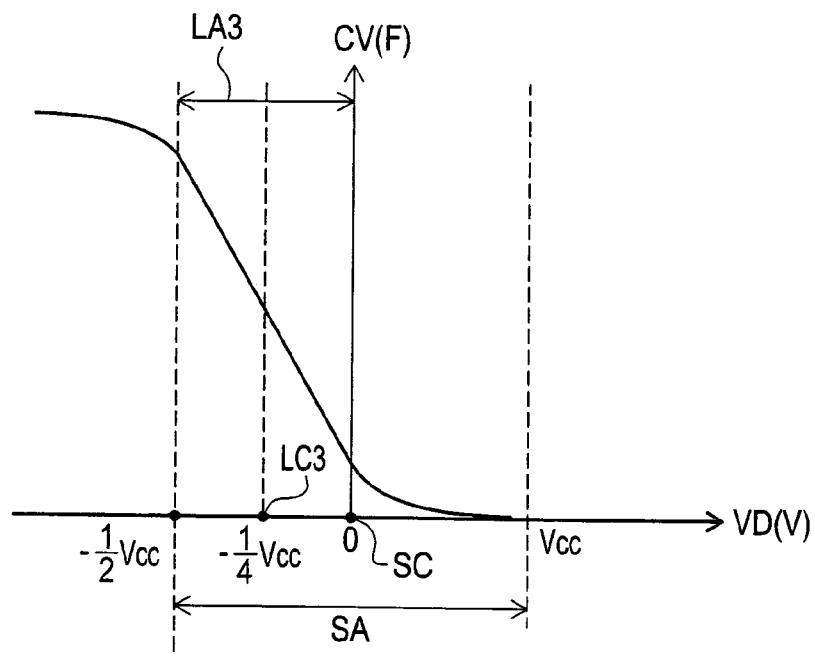
(B)
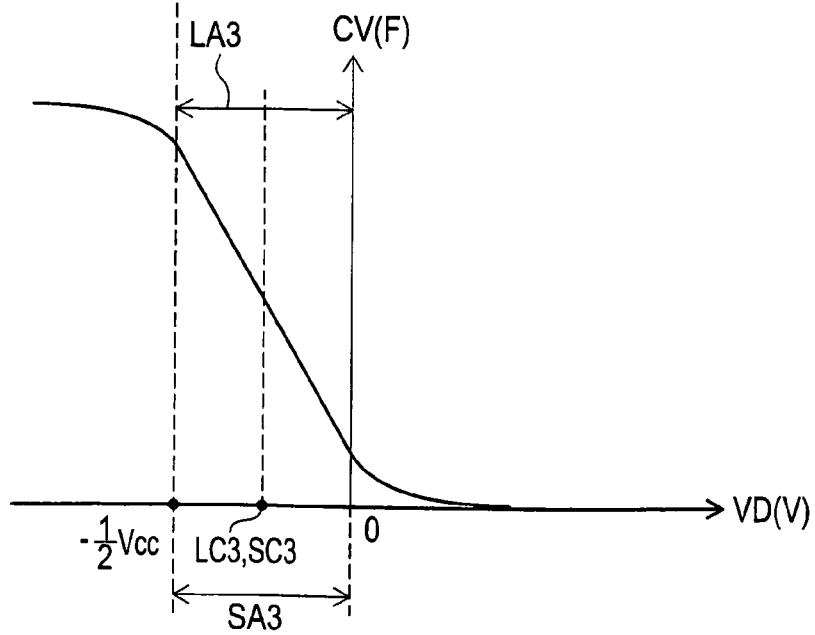

CORRELATION DIAGRAM OF CONTROL VOLTAGE VT - TERMINAL VOLTAGE VD IN THIRD EMBODIMENT

FIG. 13 CIRCUIT DIAGRAM OF CAPACITY CONTROL CIRCUIT 11b

CIRCUIT DIAGRAM OF CONVENTIONAL VOLTAGE CONTROL OSCILLATION CIRCUIT 100

VARIABLE CAPACITY CIRCUIT AND CONTROL METHOD OF VARIABLE CAPACITY CIRCUIT

CROSS-REFERENCE TO RELATED APPLICATIONS

This application is based upon and claims the benefit of priority from the prior Japanese Patent Application No. 2005-095482 filed on Mar. 29, 2005, the entire contents of which are incorporated herein by reference.

BACKGROUND OF THE INVENTION

1. Field of the Invention

The present invention relates to a variable capacity circuit and a control method of a variable capacity circuit, and more particularly to a variable capacity circuit capable of expanding a variable width of a variable capacity value to a maximum extent without increasing an element area of a variable capacity element even at low supply voltage.

2. Description of the Related Art

Recent mobile communication appliances are demanded to be smaller in size, lower in power consumption, and higher in precision. It is hence required to enhance the characteristic (precision) in wireless parts. Besides, depending on the trend of lower power consumption, the supply voltage is demanded to be much lower (lower Vcc). Especially the characteristic of voltage control oscillation circuit has a serious effect on precision of mobile appliance terminal, and it is required to satisfy both higher precision and lower power consumption at the same time.

FIG. 14 shows a conventional voltage control oscillation circuit 100. The voltage control oscillation circuit 100 comprises an oscillator unit 101, and varactors VA101 and VA102. The oscillator unit 101 is a differential oscillation circuit, and includes oscillation transistors Tr101 and Tr102 and coils L101 and L102. Varactors VA101 and VA102 are variable in capacity, and by varying the capacity by control voltage VT, a voltage control oscillation circuit is composed.

SUMMARY OF THE INVENTION

When supply voltage Vcc is supplied, the range of voltage to be applied to a variable capacity element is known to be from 0 (V) to supply voltage Vcc. At this time, when the supply voltage is lowered, and the value of supply voltage Vcc becomes smaller, the variable region of voltage applicable to the variable capacity element becomes narrower. As a result, as the variable capacity width of the variable capacity element becomes narrower, the variable width of oscillation frequency is also narrower. Hence, the variable frequency range of voltage control oscillation circuit becomes narrower.

Besides, when the variable capacity width of the variable capacity element becomes narrower, it may be considered to increase the element area of the variable capacity element in order to expand the variable region of oscillation frequency. As a result, the capacity value of the variable capacity element is increased on the whole, and the variable width of oscillation frequency may be extended. However, the element area of variable capacity element becomes larger, and the circuit size is increased. In particular, in the case of voltage control oscillation circuit of low frequency, a large capacity value is needed, and a wider element area is demanded, and problems of circuit size increase are obvious and serious.

The invention is devised to solve at least one of these problems of the background art, and it is hence an object thereof to present a variable capacity circuit and control method of variable capacity circuit capable of extending the capacity variable width of variable capacity element to a maximum extent, without increasing the element area of variable capacity element or varying the level of control voltage, even at low supply voltage.

To achieve the object, the variable capacity circuit in one aspect of the invention comprises a second voltage control circuit for receiving a first voltage and issuing a variable second voltage depending on the first voltage, and at least one variable capacity element for receiving the first voltage at one end and the second voltage at other end, and controlling a capacity value depending on a differential voltage between the first voltage and second voltage.

The second voltage control circuit receives the first voltage and issues the variable second voltage depending on the first voltage. The variable capacity element receives the first voltage at one end and the second voltage at other end, and controls the capacity value depending on the differential voltage between the first voltage and the second voltage. The variable capacity circuit comprises the second voltage control circuit and variable capacity element.

To achieve the object, the control method of variable capacity circuit in one aspect of the invention comprises the steps of issuing a variable second voltage depending on a first voltage, and controlling a capacity value of a variable capacity element depending on a differential voltage between the first voltage and the second voltage.

The step of issuing the second voltage issues the variable second voltage depending on the first voltage. The step of controlling the capacity value of variable capacity circuit controls the capacity value depending on the differential voltage between the first voltage and the second voltage.

The first voltage is a voltage for controlling the capacity value of the variable capacity circuit. The second voltage is a reference voltage for determining the differential voltage from the first voltage. The second voltage is controlled simultaneously with control of first voltage, depending on the first voltage. Depending on the differential voltage between first voltage and second voltage, the capacity value of variable capacity element is determined.

Suppose the differential voltage between the first voltage and the second voltage has a variable width with respect to change of first voltage. When the second voltage is fixed, the variable width of differential voltage is determined only by the variable width of first voltage. Hence, the variable width of first voltage and the variable width of differential voltage are equal to each other. In this case, if the supply voltage is lowered, for example, by lowering the electric power, the variable width of first voltage and the variable width of differential voltage become smaller, and the variable width of capacity value also becomes smaller. Hence, if the voltage control oscillation circuit is composed of such variable capacity circuit, the variable frequency range of the voltage control oscillation circuit becomes narrower, and the movable range cannot be assured.

However, when the second voltage is controlled simultaneously with the first voltage, the variable width of differential voltage with respect to the variable width of first voltage may be controlled. For example, by adjusting the second voltage variably so that the second voltage may have a negative correlation to the first voltage, the variable width of differential voltage may be set larger as compared with the variable width of first voltage.

As a result, since the variable region of differential voltage is expanded, the variable region of the capacity value of the variable capacity circuit can be expanded.

As a result, the variable width of differential voltage can be expanded without extending the variable width of first voltage. Since voltage level conversion of first voltage is not necessary, extra circuits such a as step-down circuit and a boosting circuit are not needed, and thereby it is possible to prevent the increase of circuit scale of the capacity value control circuit, and to reduce the consumption current.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 8 is a circuit diagram of a capacity control circuit 11a;

FIG. 9 is a characteristic curve of terminal voltage VD—varactor capacity value CV in second embodiment;

FIG. 11 is a characteristic curve of terminal voltage VD—varactor capacity value CV in third embodiment;

DETAILED DESCRIPTION OF THE PREFERRED EMBODIMENTS

The variable capacity circuit of the invention is described below by referring to a case of application in voltage control oscillation circuit. First to third embodiments of the invention are explained in FIGS. 1 to 13.

Figure 1:
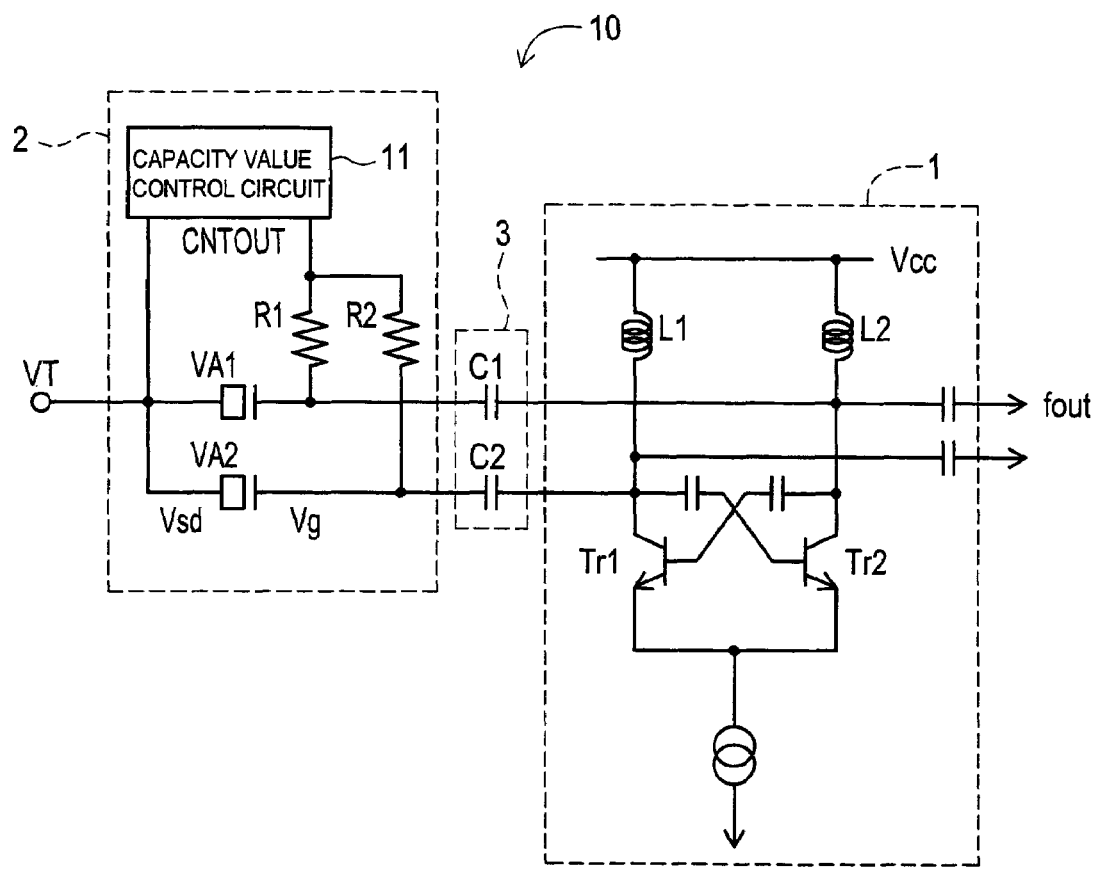
FIG. 1 is a circuit diagram of a voltage control oscillation circuit 10.

The first embodiment is shown in FIGS. 1 to 8. FIG. 1 is a circuit diagram of a voltage control oscillation circuit 10 of the invention. The voltage control oscillation circuit 10 comprises an oscillator unit 1, a variable capacity circuit 2, and a capacitor unit 3. The oscillator unit 1 is a differential oscillation circuit, which includes oscillation transistors Tr1 and Tr2 and coils L1 and L2. The oscillator unit 1 issues an output signal fout having oscillation frequency fvco.

The variable capacity circuit 2 includes a capacity value control circuit 11, varactors VA1 and VA2, and resistance elements R1 and R2. Control voltage VT is applied to terminals Vsd of varactors VA1 and VA2. Control voltage VT is also applied to the capacity value control circuit 11. The capacity value control circuit 11 issues a variable output voltage CNTOUT depending on the input control voltage VT. Output voltage CNTOUT is applied to a terminal Vg of a varactor VA1 and a capacitor C1 of a capacitor unit 3 by way of a resistance element R1. Output voltage CNTOUT is also applied to a terminal Vg of a varactor VA2 and a capacitor C2 of the capacitor unit 3 by way of a resistance element R2.

The capacitor unit 3 is provided on a connection route of the oscillator unit 1 and the variable capacity circuit 2. Terminal Vg of the varactor VA1 is connected to a coil L2 by way of the capacitor C1. At the same time, the terminal Vg of the varactor VA2 is connected to a coil L1 by way of the capacitor C2. By the capacitors C1 and C2, the oscillator unit 1 and the variable capacity circuit 2 are connected in mutually insulated state. Hence, effects of the oscillator unit 1 can be avoided. Therefore, as described below, voltage Vg can be varied freely by output voltage CNTOUT.

Figure 2:
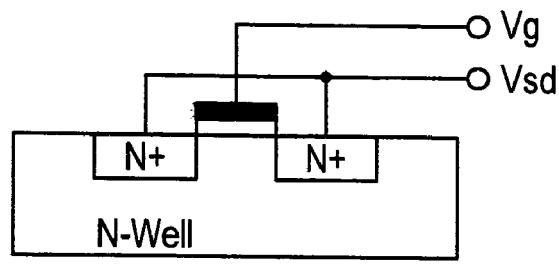
FIG. 2 is a configuration example of varactors VA1 and VA2.

Examples of the varactors VA1 and VA2 are shown in FIG. 2. FIG. 2 is a schematic diagram of an accumulation mode MOSFET varactor element. N+ channel region is formed in an N well region. A source terminal and drain terminal are short-circuited, and connected to the terminal Vsd. A gate terminal is connected to the terminal Vg.

Figure 3:
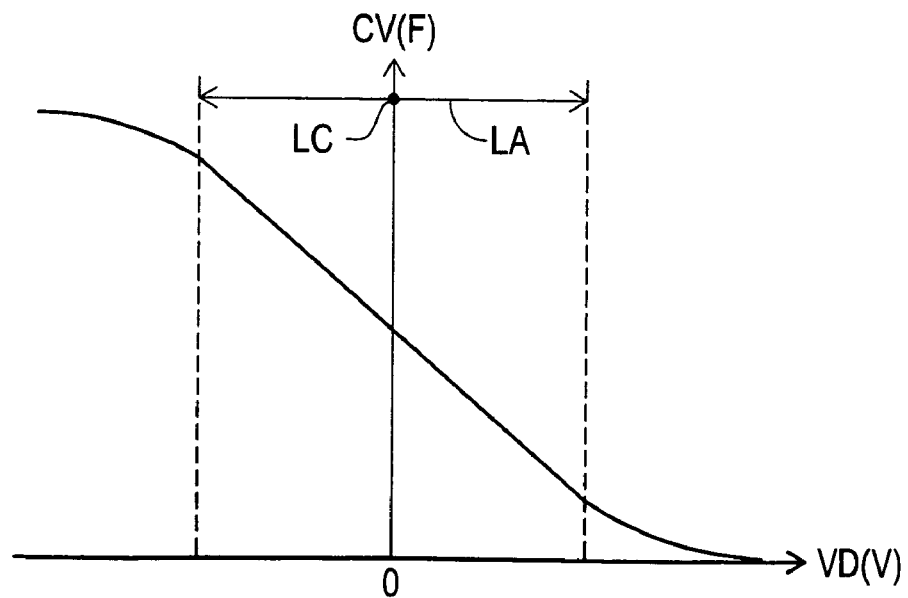
FIG. 3 is a characteristic curve of terminal voltage VD—varactor capacity value in varactors VA1 and VA2.

In the varactors VA1 and VA2 in FIG. 2, the correlation of terminal voltage VD and a varactor capacity value CV is shown in FIG. 3. Herein, the terminal voltage VD is differential voltage (voltage Vsd−voltage Vg) between the terminal Vsd and the terminal Vg in the varactors VA1 and VA2. Region of the varactor capacity value CV showing a linear response to the terminal voltage VD is indicated as a linear area LA. In the varactor of the accumulation mode, as shown in FIG. 3, it is a feature that the linear area LA is present in both regions of positive direction and negative direction of the terminal voltage VD. The varactors VA1 and VA2 used in this embodiment are supposed to be set so that the center value LC of the linear area LA may coincide with the point of terminal voltage VD=0.

Operation of the voltage control oscillation circuit 10 is explained. Oscillation frequency fvco of an output signal fout issued from the oscillator unit 1 is expressed as follows.

$$fvco = 1/(2\pi(L \times C)^{1/2}) \quad (1)$$

Inductance L is determined by the coils L1 and L2. Capacitance C is determined by a combined capacity of capacity values of the varactors VA1 and VA2 and the capacitors C1 and C2. Capacity values of the varactors VA1 and VA2 are variable depending on the terminal voltage VD controlled depending on control voltage VT. That is, the capacitance C in a formula (1) can be controlled by the control voltage VT. As a result, the oscillation frequency fvco of output signal fout can be controlled by the control voltage VT.

Figure 4:
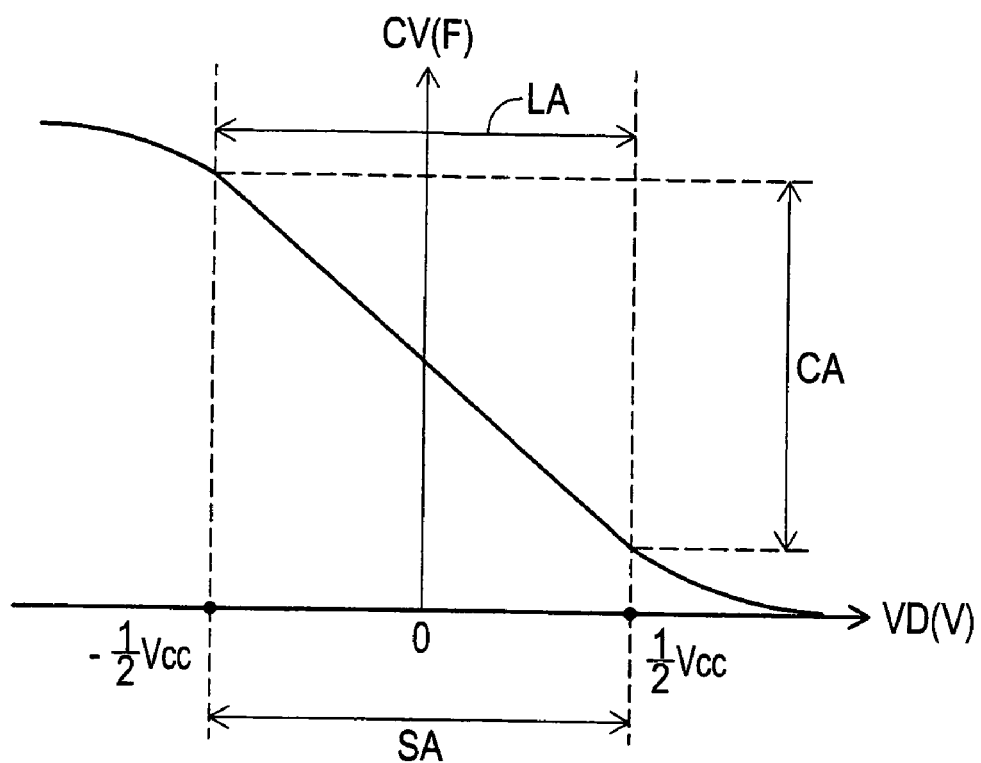
FIG. 4 is an ideal characteristic curve of terminal voltage VD—varactor capacity value CV.

FIG. 4 shows a correlation of the terminal voltage VD and the varactor capacity value CV which is regarded to be ideal for the varactors VA1 and VA2. Suppose the variable width of control voltage VT to be from 0 (V) to Vcc. Corresponding to the variable width of control voltage VT, the variable width of terminal voltage VD is supposed to be from −(Vcc)/2 to (Vcc)/2. As shown in FIG. 4, when a variable width SA of the terminal voltage VD and the linear area LA coincide, the linear area LA can be utilized to the maximum extent. In this case, therefore, the C/N characteristic (noise ratio) is the best, and it is an ideal correlation. At this time, in FIG. 4, the variable region of varactor capacity value CV corresponding to the variable width SA is defined to be the variable region CA.

Figure 5:
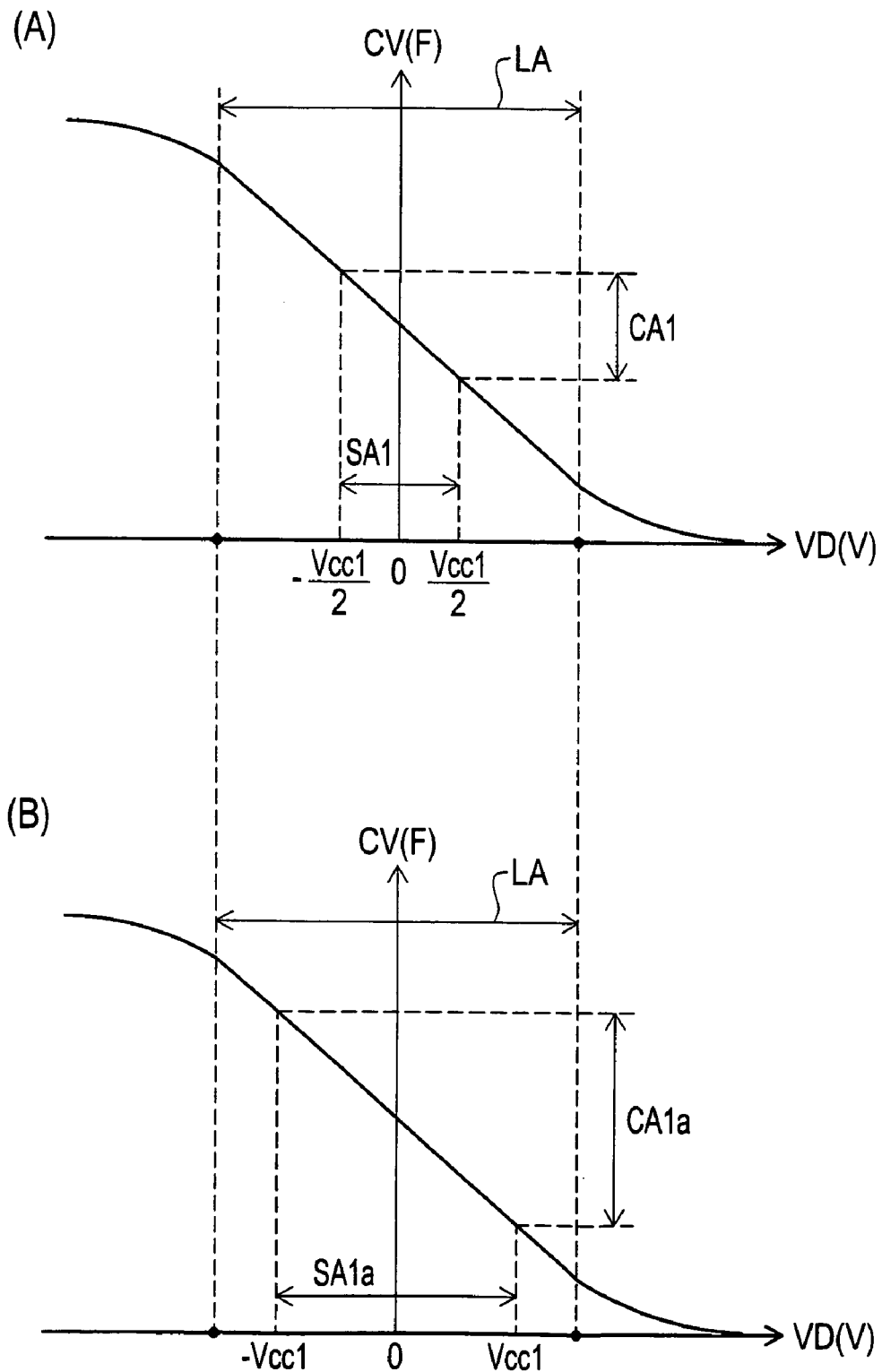
FIG. 5 is a characteristic curve of terminal voltage VD—varactor capacity value CV in first embodiment.
Figure 6:
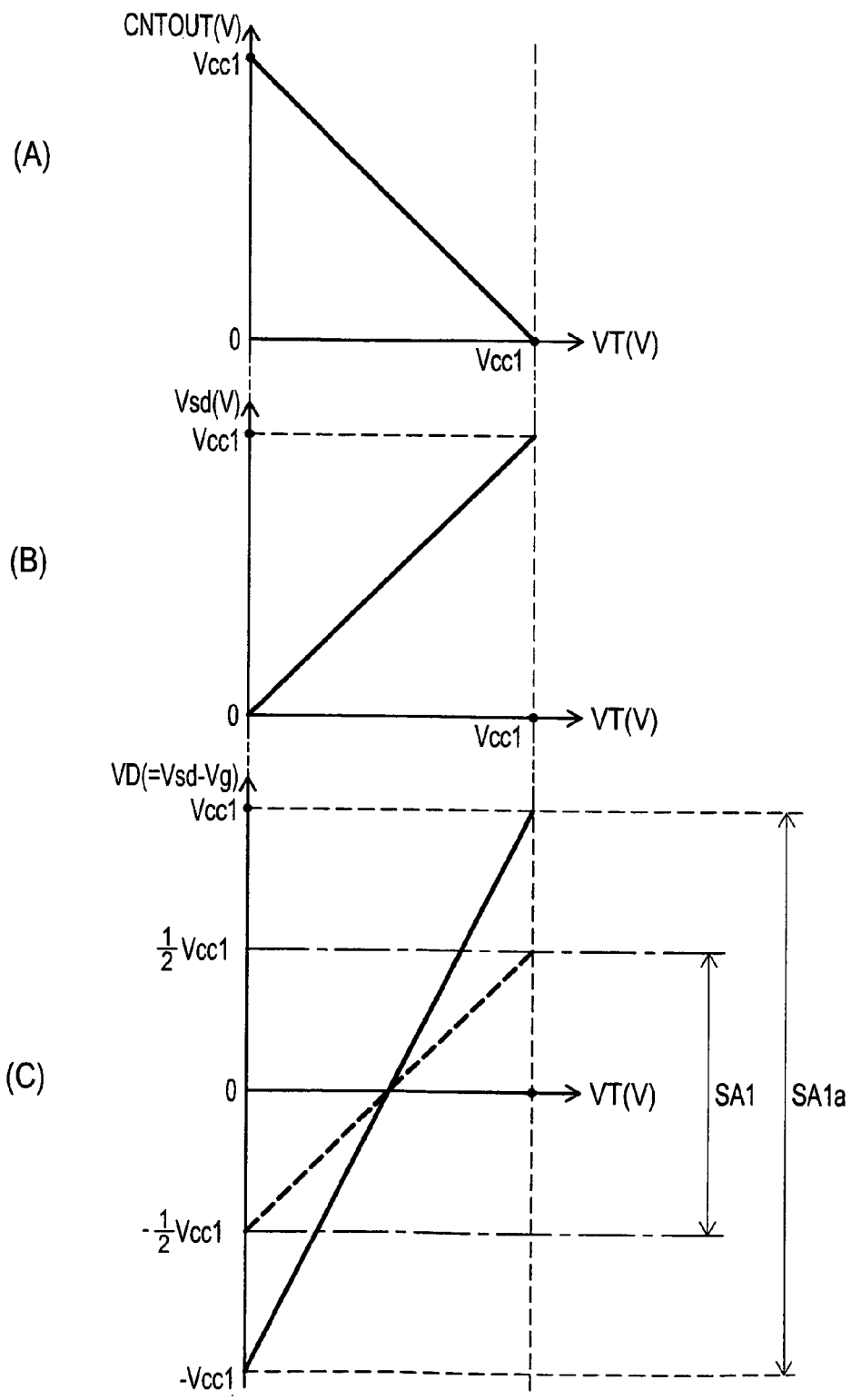
FIG. 6 is a correlation diagram of control voltage VT—terminal voltage VD in first embodiment.
Figure 7:
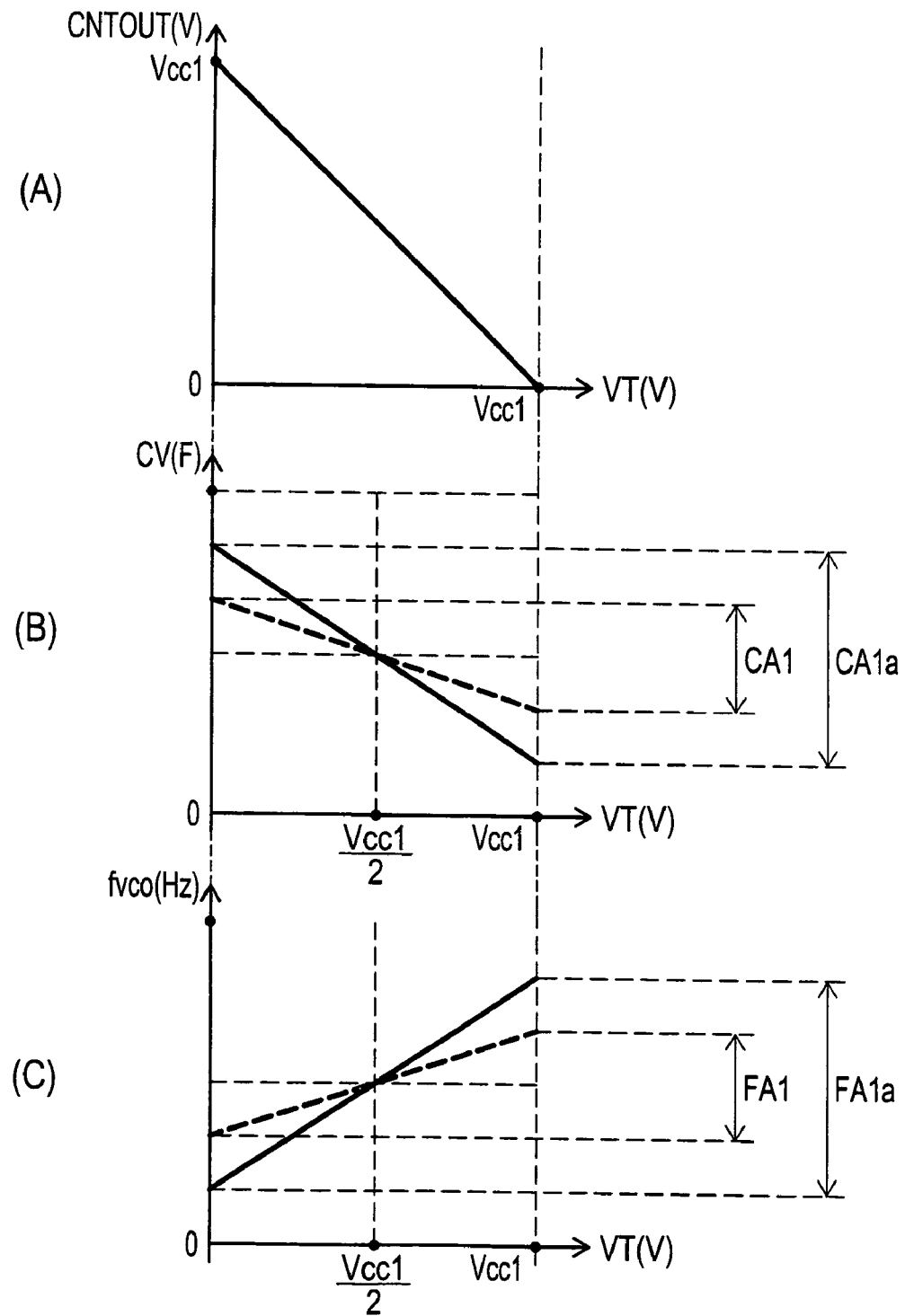
FIG. 7 is a correlation diagram of control voltage VT—oscillation frequency fvco in first embodiment.

Along with reduction of power consumption of the voltage control oscillation circuit 10, when supply voltage Vcc is lowered to Vcc1 without modifying a varactor structure, a conventional operation is explained by referring to FIG. 5. As the supply voltage is lowered to Vcc1, the amplitude of terminal voltage VD ranges from −(Vcc1)/2 to (Vcc1)/2. This variable width is defined as a variable width SA1 (FIG. 5). Variable width SA1 is narrower than the variable width SA (FIG. 4). The varactor characteristics are the same. Therefore, as the variable width becomes narrower from the variable width SA (FIG. 4) to SA1 (FIG. 5), the variable region of varactor capacity value becomes narrower from the variable region CA to CA1. When the variable region of varactor capacity value CV becomes narrower, the variable region of oscillation frequency fvco of output signal fout also become narrower. As a result, the variable frequency range of voltage control oscillation circuit 10 cannot be guaranteed.

By increasing the element area of varactor and increasing the capacity value on the whole, it may be considered to increase the change inclination of varactor capacity value CV in relation to terminal voltage VD. As a result, the same variable width of terminal voltage VD, the variable region of varactor capacity value CV may be expanded. But along with the increase of element area of varactor, the occupied area of voltage control oscillation circuit 10 increases, which causes another problem. In particular, in the case of the voltage control oscillation circuit of a low frequency, since a large element area is needed, and the increase of occupied area cannot be ignored. It is hence desired to extend the variable width of terminal voltage VD without changing the element area of varactor.

In the first embodiment, alone with the decline of supply voltage Vcc, when the variable width SA1 of terminal voltage VD becomes narrower (FIG. 5A), means for extending the variable width of terminal voltage VD without increasing the element area of varactor is explained.

In this embodiment, the oscillator unit 1 and the variable capacity circuit 2 are insulated from each other by means of the capacitor unit 3, and output voltage CNTOUT of the capacity value control circuit 11 is applied to the terminal Vg. FIG. 6A shows input and output characteristics of the capacity value control circuit 11. In proportion to the increase of control voltage VT, output voltage CNTOUT drops. That is, output voltage CNTOUT is adjusted variably so as to have a negative correlation to control voltage VT. FIG. 6B shows the correlation of control voltage VT and voltage Vsd applied to the terminal Vsd. Control voltage VT and voltage Vsd correspond to each other one by one.

FIG. 6C shows the correlation of control voltage VT and terminal voltage VD. The correlation in prior art is indicated by dotted line, and the correlation in the embodiment is indicated by solid line. Hitherto, voltage Vg is fixed ((Vcc1)/2), and only voltage Vsd is controlled, and hence the variable range of terminal voltage VD is +/−(Vcc1)/2. Hence, the variable width of terminal voltage VD is the variable width SA1.

In the embodiment, on the other hand, output voltage CNTOUT is applied to the terminal Vg. This terminal Vg is connected to the oscillator unit 1 by way of the capacitors C1 and C2. Hence, regardless of the output voltage of oscillator unit 1, the value of voltage Vg can be determined only by output voltage CNTOUT. Hence, in this embodiment, voltage Vsd can be controlled by control voltage VT, and voltage Vg can be simultaneously controlled by output voltage CNTOUT. This voltage Vg is the same voltage as output voltage CNTOUT.

A low pass filter is composed of resistance elements R1 and R2, and the capacitor unit 3. Hence, the capacity value control circuit 11 can apply output voltage CNTOUT, which is a direct-current portion, to terminal Vg by way of resistance elements R1 and R2. On the other hand, the alternating-current portion of voltage fluctuations corresponding to oscillation frequency fvco is cut off by this low pass filter, and no effect is given to the capacity value control circuit 11. Hence, the capacity value control circuit 11 can supply stable output voltage CNTOUT regardless of fluctuations voltage Vg.

In the embodiment, therefore, the variable width of terminal voltage VD can be extended from the variable width SA1 to a variable width SA1a (range is +/−(Vcc1)). At this time, as compared with a variable width +/−(Vcc1)/2 of the variable width SA1, the variable width of variable width SA1a is +/−(Vcc1). Hence, the variable width is 2 times broader. As shown in FIG. 5B, by extending from the variable width SA1 to the variable width SA1a, the variable region of varactor capacity value CV can be extended from the variable region CA1 to the variable region CA1a.

Dependence on the control voltage VT is explained. FIG. 7A shows a correlation of control voltage VT—output voltage CNTOUT, FIG. 7B shows a correlation of control voltage VT—varactor capacity value CV, and FIG. 7C shows a correlation of control voltage VT—oscillation frequency fvco. The correlation in prior art is indicated by dotted line, and the correlation in the embodiment is indicated by solid line. As shown in FIG. 7B, while the amplitude of control voltage VT is constant (from 0 (v) to Vcc), the variable width of varactor capacity value CV can be extended from the variable region CA1 to CA1a. In addition, as shown in FIG. 7C, depending on the increase of variable width of varactor capacity value CV, the variable width of oscillation frequency fvco can be also extended from a variable width FA1 to a variable width FA1a. Thus, without increasing the element area of varactor, the variable frequency range of output signal fout can be obtained in a broad scope while keeping constant the amplitude of control voltage VT.

Change rate (FIG. 6C) of terminal voltage VD relative to control voltage VT can be controlled by changing the change rate (FIG. 6A) of output voltage CNTOUT relative to control voltage VT. That is, to decrease the change rate of terminal voltage VD relative to control voltage VT, in FIG. 6A, the decreasing rate of output voltage CNTOUT relative to control voltage VT is set smaller. As a result, by controlling the change rate of control voltage VT—output voltage CNTOUT, the change rate of control voltage VT—terminal voltage VD can be controlled, and finally the change rate of control voltage VT—varactor capacity value CV can be controlled.

Figure 8:
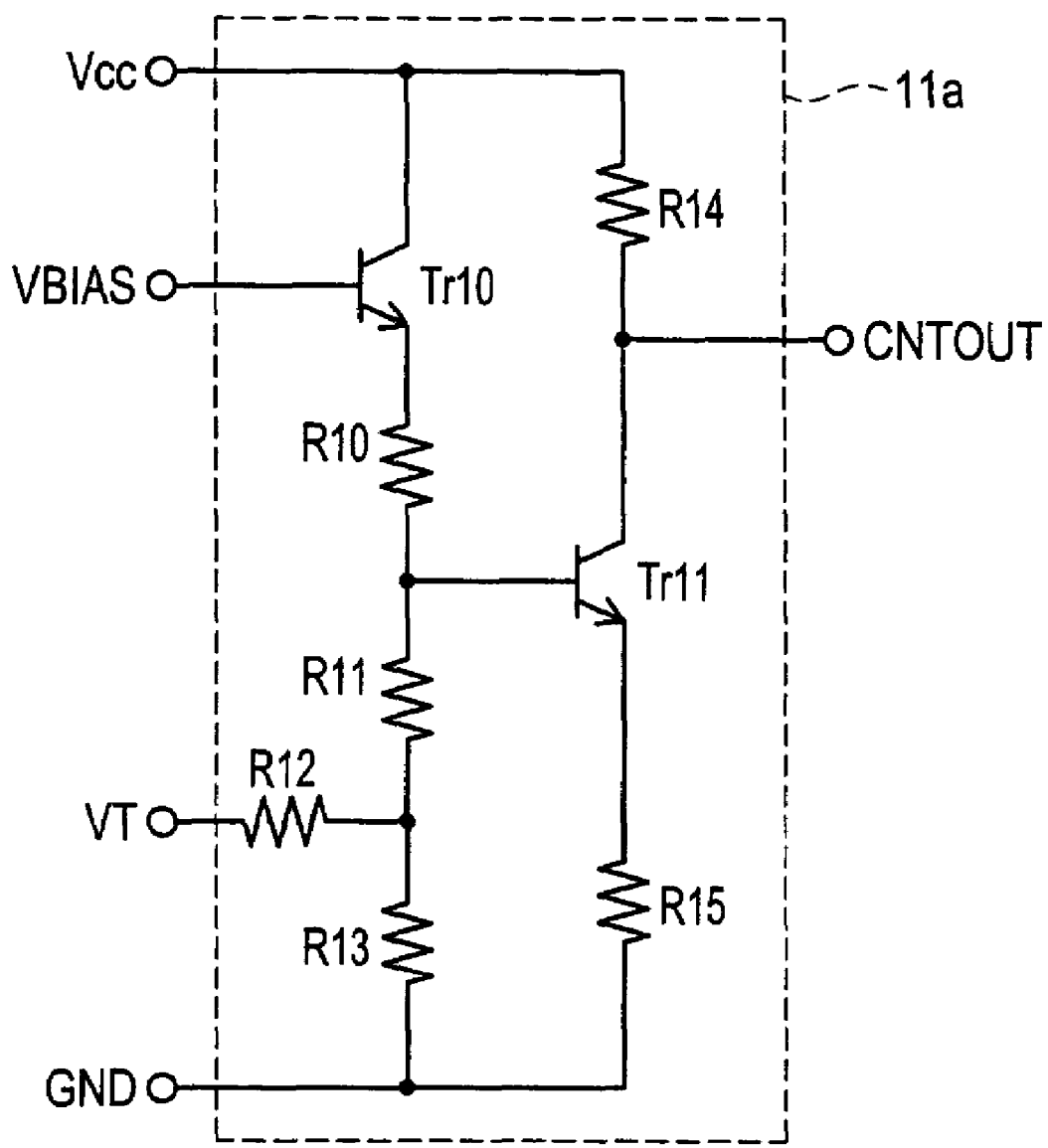

FIG. 8 shows a capacity value control circuit 11a as a specific example of capacity value control circuit. The capacity value control circuit 11a includes transistors Tr10 and Tr11, and resistance elements R10 to R15. The capacity value control circuit 11a receives supply voltage Vcc, grounding voltage GND, bias voltage VBIAS, and control voltage VT, and issues output voltage CNTOUT. By application of bias voltage VBIAS, the transistor Tr10 is set in conductive state, and the emitter terminal of transistor Tr10 has a constant voltage.

When the control voltage VT elevates, the base voltage of transistor Tr11 drops, and the emitter terminal potential of transistor Tr11 descends, and hence the current flowing into terminal CNTOUT decreases. Accordingly, the output voltage CNTOUT drops along with elevation of control voltage VT. On the other hand, when the control voltage VT descends, the emitter terminal potential of transistor Tr11 ascends, and the current flowing into terminal CNTOUT increases. Accordingly, the output voltage CNTOUT elevates along with drop of control voltage VT. Thus, the input and output characteristic of the capacity value control circuit 11 is obtained as shown in FIG. 6A.

As described specifically herein, in the voltage control oscillation circuit 10 of the first embodiment, the potentials at both ends of the varactor can be controlled simultaneously by using the capacity value control circuit 11. Hence, the variable width SA of terminal voltage VD can be extended without increasing the element area of varactor or raising or lowering the supply voltage. Therefore, the linear area of terminal voltage VD—varactor capacity value CV characteristic can be expanded, and the variable capacity width of varactor capacity value CV can be extended. It is hence possible to guarantee the variable frequency range of voltage control oscillation circuit, in a state of low power consumption, without increasing the varactor area, while maintaining the same circuit scale.

Figure 10:
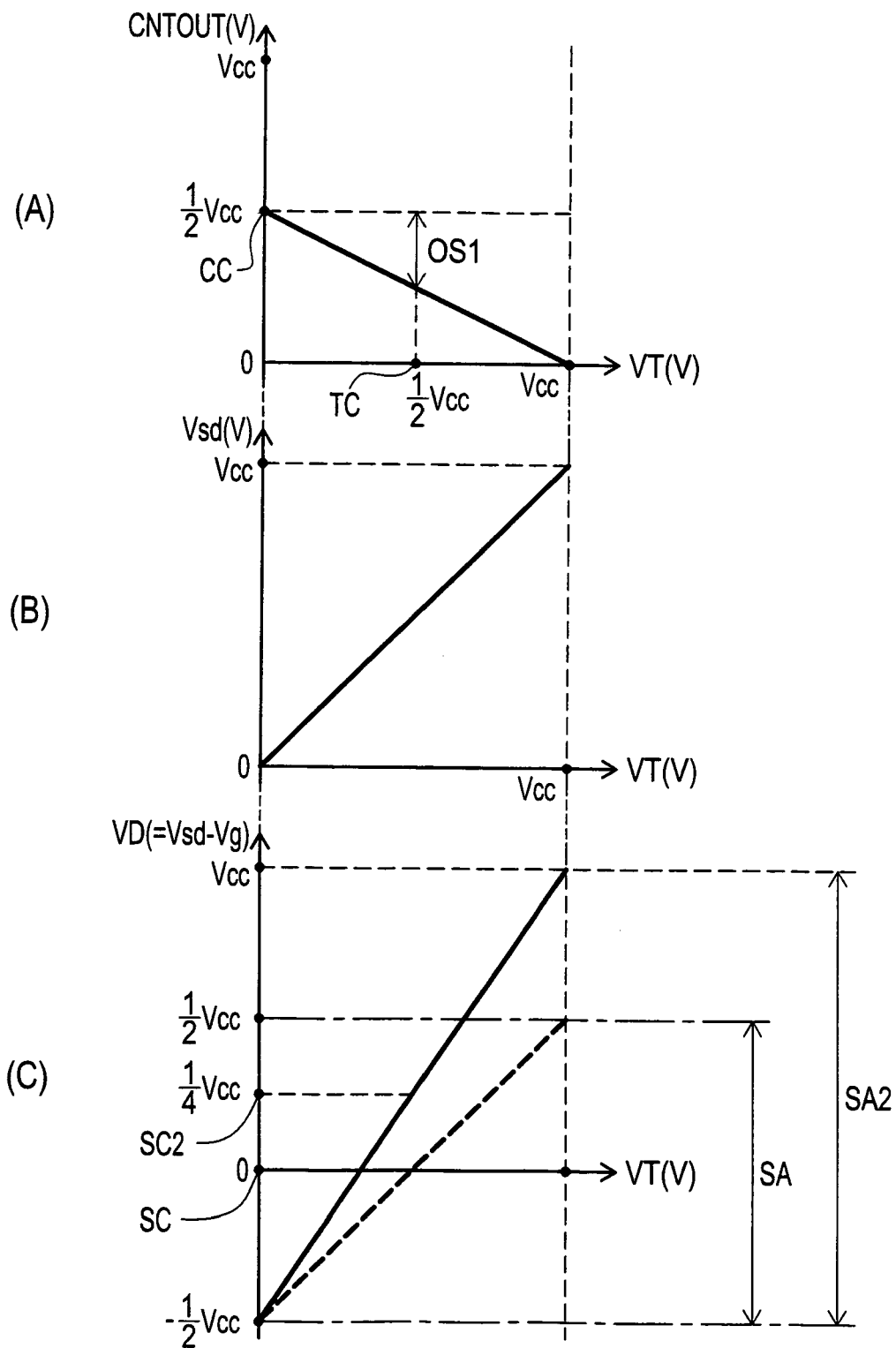
FIG. 10 is a correlation diagram of control voltage VT—terminal voltage VD in second embodiment.

A second embodiment is explained by referring to FIGS. 9 and 10. The second embodiment relates to a control method in the case of shifting of characteristic of terminal voltage VD—varactor capacity value CV due to manufacturing fluctuations of varactors VA1 and VA2. The structure of the voltage control oscillation circuit 10 used in the second embodiment is same as in the first embodiment, and its explanation is omitted.

FIG. 9A shows the case that the center value of linear area LA2 existing in the center value LC ((Vcc)/4) by shifting to the higher side of center value SC of variable width SA. In this case, the ideal variable region (target capacity range) of varactor capacity value CV is variable region CA2. Hence, the ideal variable width of terminal voltage VD is equal to the linear area LA2. However, an actual variable width is the variable width SA. At this time, the center value LC of liner area LA2 and the center value SC of the variable width SA do not coincide with each other. In this state, when the variable width SA is extended to both sides from the center value SC, in the lower side region of terminal voltage VD, non-linear area is utilized. As a result, response of varactor capacity value CV relative to terminal voltage VD is not obtained linearly in non-linear area, and it is hard to control the oscillation frequency fvco at high precision.

Hence by applying the offset corresponding to the difference between the center value LC and the center value SC to the output voltage CNTOUT, it is required to match the both center values. The offset applying method is explained below.

FIG. 10A shows input and output characteristics of the capacity value control circuit 11. The control voltage VT—output voltage CNTOUT characteristic is negatively offset by the portion of offset OS1 from the center value CC of output voltage CNTOUT, in the center value TC of control voltage VT. It is also adjusted variably so that the output voltage CNTOUT may have a negative correlation to control voltage VT.

FIG. 10B shows the correlation of control voltage VT and voltage Vsd applied to the terminal Vsd. Control voltage VT and voltage Vsd correspond to each other one by one. FIG. 10C shows the correlation of control voltage VT and terminal voltage VD. The correlation in prior art is indicated by dotted line, and the correlation in the embodiment is indicated by solid line. Hitherto, voltage Vg is fixed (Vcc/2), and the variable width of terminal voltage VD is the variable width SA (variable range is +/−(Vcc)/2). Center value SC of the variable width SA is present at the position of terminal voltage VD=0 (V).

On the other hand, in the embodiment, the output voltage CNTOUT with offset OS1 is applied to the terminal Vg. As a result, the variable width of terminal voltage VD is a variable width SA2 (from −(Vcc)/2 to Vcc). Center value SC2 of the variable width SA2 is the position of terminal voltage VD=Vcc/4. By controlling voltage Vg by output voltage CNTOUT having negative offset, the center value SC (0 (V)) of the variable width SA can be moved by Vcc/4 in a positive direction, and center value SC2 (Vcc/4) is obtained. Accordingly, the variable width of terminal voltage VD can be extended asymmetrically, and the center value of variable width can be shifted.

The input and output characteristics of the capacity value control circuit 11 in FIG. 10A can be obtained by properly changing the resistance value of resistance element and others in the capacity value control circuit 11a in FIG. 8. After completion of the semiconductor device having the voltage control oscillation circuit 10, depending on the results of function tests and others, the input and output characteristics of the capacity value control circuit 11 may be adjusted to conform in individual semiconductor devices.

As described specifically herein, in the voltage control oscillation circuit 10 of the second embodiment, the potentials at both ends of the varactor can be controlled simultaneously by using the capacity value control circuit 11. At this time, by applying offset, the voltage at the voltage Vg side is controlled by the output voltage CNTOUT changed in inclination to the control voltage VT. As a result, while moving center value SC of variable width of terminal voltage VD so as to coincide with the center value LC, the variable width SA can be extended. Therefore, the terminal voltage VD can be adjusted to conform so that the target capacity range (variable region CA2) of the variable capacity element can be utilized effectively, depending on the characteristics of individual varactors. Hence it is possible to widen the linear area of terminal voltage VD—varactor capacity value CV characteristics, and the variable capacity width of varactor capacity value CV can be extended. It is hence possible to guarantee the variable frequency range of voltage control oscillation circuit, in a state of low power consumption, without increasing the varactor area, while maintaining the same circuit scale.

Figure 12:
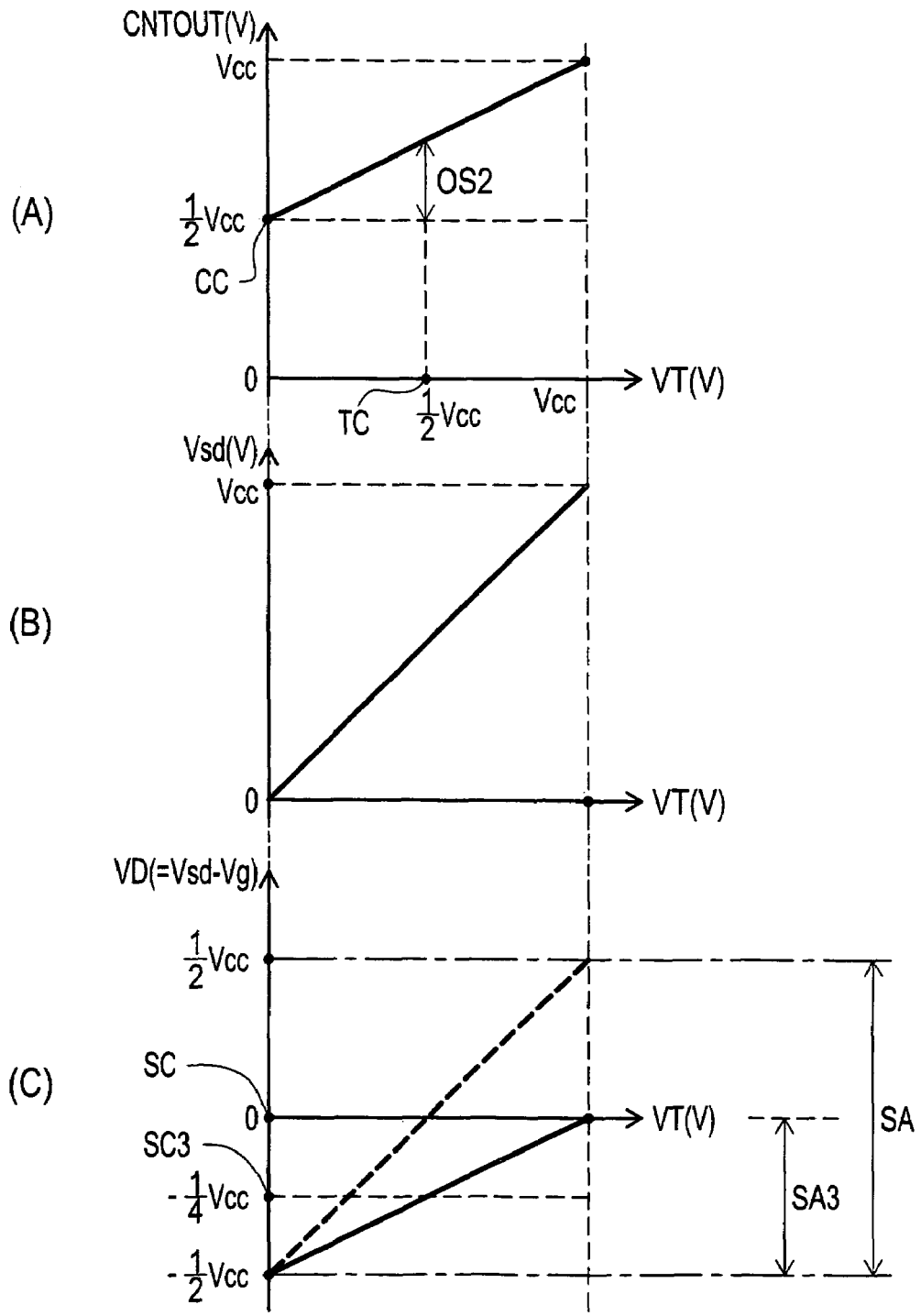
FIG. 12 is a correlation diagram of control voltage VT—terminal voltage VD in third embodiment.
Figure 13:
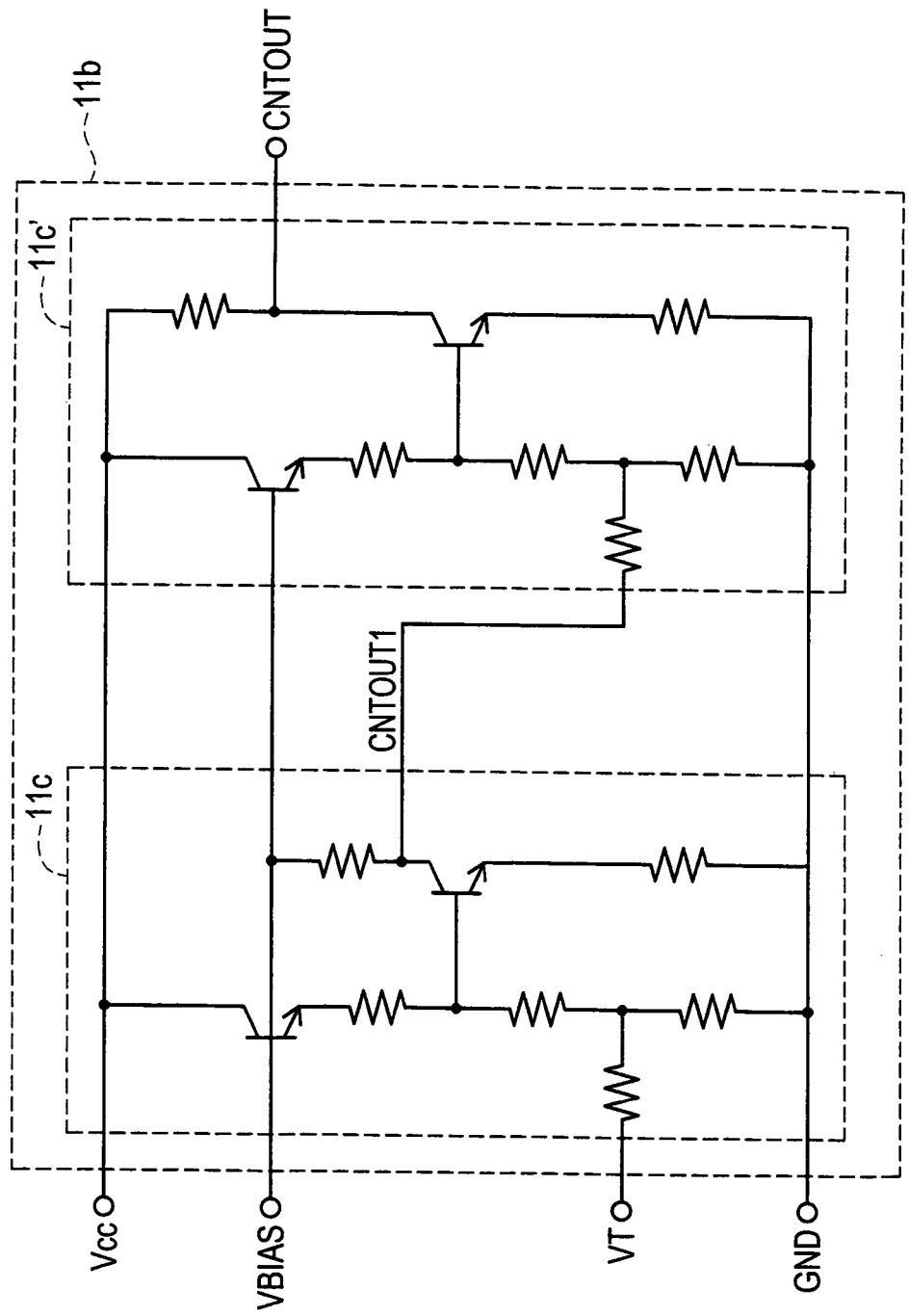
FIG. 13 is a circuit diagram of a capacity control circuit 11b.
Figure 14:
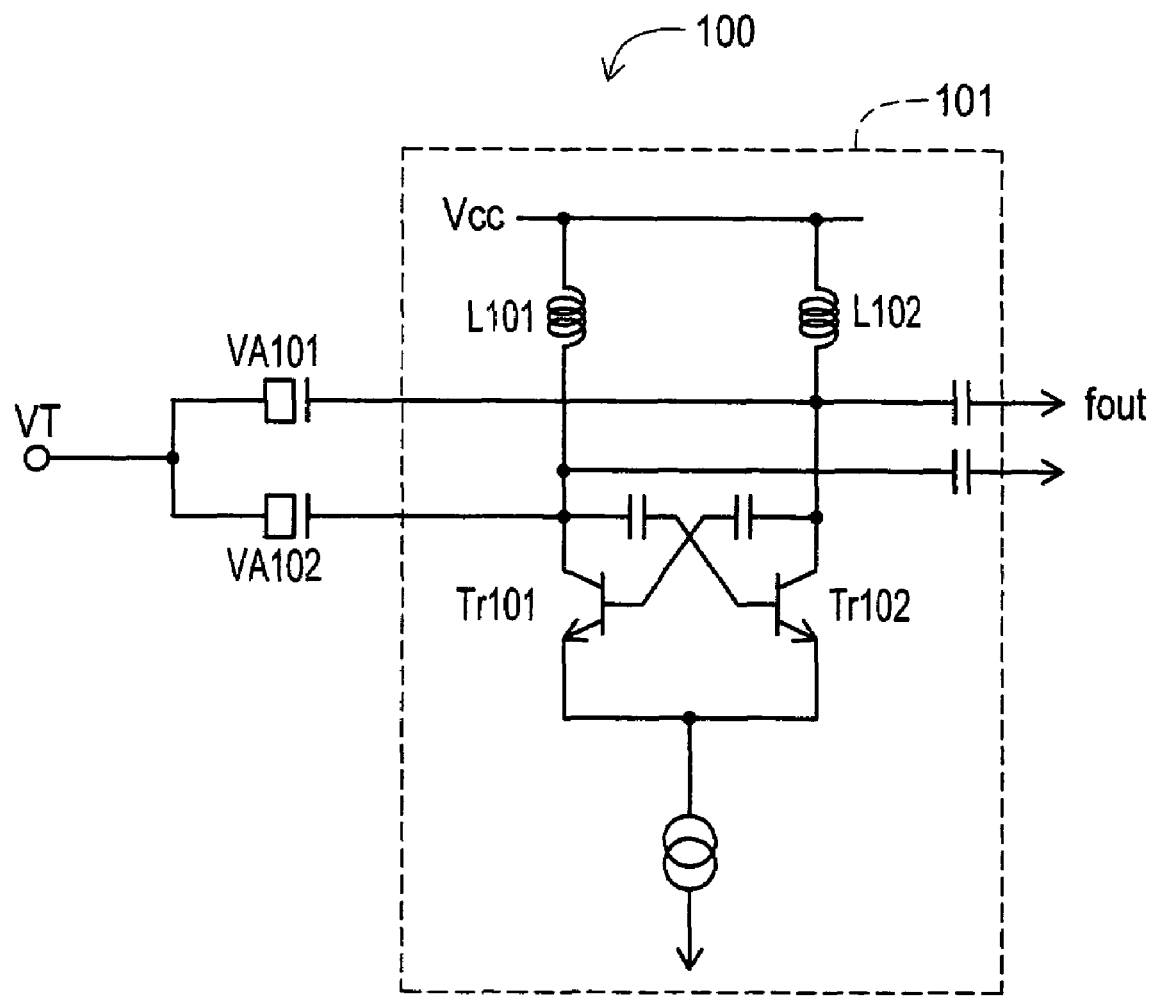
FIG. 14 is a circuit diagram of a conventional voltage control oscillation circuit 100.

A third embodiment is explained by referring to FIGS. 11 to 13. The third embodiment relates to a control method in the case of the increase of variable width SA of terminal voltage VD, relatively to a linear area LA3, due to manufacturing fluctuations of varactors VA1 and VA2. The structure of the voltage control oscillation circuit 10 used in the third embodiment is same as in the first embodiment, and its explanation is omitted.

In FIG. 11 (A), the variable width SA of terminal voltage VD is wider than the linear area LA3. At the same time, the center value LC3 (−(Vcc)/4) of linear area LA3 is shifted to the lower side of center value SC of the variable width SA. In this case, in a range from 0 (V) to Vcc of terminal voltage VD of the variable width SA, a region other than the linear area LA3 is used. Hence, the varactor capacity value CV linearly corresponding to terminal voltage VD cannot be obtained. As a result, the oscillation frequency fvco cannot be controlled at high precision. In order that the variable width SA should coincide with the linear area LA3, a method of narrowing the variable width SA and shifting the center value SC is explained below.

FIG. 12A shows input and output characteristics of the capacity value control circuit 11. In the first and second embodiments, the output voltage CNTOUT is variably adjusted so as to have a negative correlation to the control voltage VT. In this embodiment, the output voltage CNTOUT is variably adjusted so as to have a positive correlation to the control voltage VT.

In the control voltage VT-output voltage CNTOUT characteristics, in the center value TC of control voltage VT, a positive offset is applied for the portion of offset OS2 from the center value CC of output voltage CNTOUT.

FIG. 12B shows the correlation of control voltage VT and voltage Vsd applied to the terminal Vsd. Control voltage VT and voltage Vsd correspond to each other one by one. FIG. 12C shows the correlation of control voltage VT and terminal voltage VD (=Vsd−Vg). The correlation in prior art is indicated by dotted line, and the correlation in the embodiment is indicated by solid line. Hitherto, voltage Vg is fixed (Vcc/2), and the variable width of terminal voltage VD is a variable width SA (variable range is +/−(Vcc)/2). Center value SC of the variable width SA is present at the position of terminal voltage VD=0 (V).

On the other hand, in the embodiment, the output voltage CNTOUT with offset OS2 is applied to terminal Vg. Besides, as shown in FIGS. 12A and 12B, as the control voltage VT changes, the output voltage CNTOUT and voltage Vsd change in the same direction. As a result, the inclination of terminal voltage VD to control voltage VT is moderate, and the variable width of terminal voltage VD is a variable width SA3 (from −(Vcc)/2 to 0 (V)). Center value SC3 of the variable width SA3 is the position of terminal voltage VD=−(Vcc)/4. By controlling voltage Vg by output voltage CNTOUT having positive offset, the center value SC (0 (V)) of the variable width SA can be moved by Vcc/4 in a negative direction, and the center value SC3 is obtained. Accordingly, the variable width of terminal voltage VD can be contracted asymmetrically, and the center value of the variable width can be shifted.

FIG. 13 shows a capacity value control circuit 11b as a specific example of capacity value control circuit. The capacity value control circuit 11b is composed by series connection of the capacity value control circuits 11c and 11c'. Output voltage CNTOUT1 issued from the capacity value control circuit 11c is put into the capacity value control circuit 11c', and output voltage CNTOUT is issued from the capacity value control circuit 11c'. The capacity value control circuits 11c and 11c' are same in structure as the capacity value control circuit 11a shown in FIG. 8, and the explanation is omitted.

Depending on elevation of control voltage VT, output voltage CNTOUT1 of the capacity value control circuit 11c descends. Depending on fall of output voltage CNTOUT1, output voltage CNTOUT of the capacity value control circuit 11c' ascends. As a result, depending on increase of control voltage VT, output voltage CNTOUT also increases, and the input and output characteristics shown in FIG. 12A can be obtained.

As described specifically herein, in the voltage control oscillation circuit 10 of the third embodiment, the potentials at both ends of varactor can be controlled simultaneously by using the capacity value control circuit 11. At this time, by applying offset, the voltage at the voltage Vg side is controlled by the output voltage CNTOUT changed in inclination to the control voltage VT. As a result, the center value of a variable width of terminal voltage VD can be set by the capacity value control circuit 11. Hence, the variable width SA can be narrowed. Therefore, the terminal voltage VD can be adjusted to conform to the linear area of the individual varactors. It is hence possible to guarantee the precision of variable frequency of the voltage control oscillation circuit because the linear varactor capacity value CV characteristic can be obtained in relation to the control voltage VT.

The invention is not limited to these embodiments alone, but may be changed and modified in various modes within a scope not departing from the true spirit of the invention. For example, in the first to third embodiments, terminals Vg (FIG. 2) of varactors VA1 and VA2 are connected to the output terminal of capacity value control circuit 11, but the invention is not limited to this mode alone. By inverting the connecting direction of varactors, terminal Vsd may be connected to the output terminal of capacity value control circuit 11, and control voltage VT may be applied to terminal Vg. In this case, the correlation of control voltage VT—oscillation frequency fvco, and the correlation of control voltage VT—varactor capacity value CV are inverted in polarity shown in FIG. 7. That is, as the control voltage VT elevates, the oscillation frequency fvco drops. Or as the control voltage VT elevates, the varactor capacity value CV elevates.

In the foregoing embodiments, varactors VA1 and VA2 (FIG. 1, FIG. 2) are used as variable capacity used in the voltage control oscillation circuit 10, but not limited to them, variable capacity diodes may be used. For example, the anode side of variable capacity diode is connected to the output terminal of capacity value control circuit 11, and output voltage CNTOUT is applied, and control voltage VT is applied to the cathode side. In this case, in order that the variable capacity diode should operate as variable capacity, the control voltage VT must be larger than the output voltage CNTOUT.

In the foregoing embodiments, the variable capacity used in the voltage control oscillation circuit 10 is a variable capacity having linear areas in both regions of positive direction and negative direction of terminal voltage VD as shown in FIG. 3, but the invention is not limited to this type alone. For example, a variable capacity element having a linear area only in a region of one direction may be used. In a varactor using inversion mode MOS transistor, for instance, since PN junction is present, a linear area of variable capacity is present only in a region of application of inverse bias voltage. In this case, too, the potentials at both ends of varactor can be controlled simultaneously by using the capacity value control circuit 11. Hence, the variable width of terminal voltage can be extended without increasing the element area of varactor or without raising or lowering the supply voltage.

Output voltage CNTOUT issued from the capacity value control circuit 11 is commonly applied to varactors VA1 and VA2, but it is not specified. Two sets of capacity value control circuit 11a (FIG. 8) may be provided in the capacity value control circuit 11, and output voltage CNTOUT1 for varactor VA1 and output voltage CNTOUT2 for varactor VA2 may be supplied individually. As a result, if there is a characteristic difference of capacity fluctuation between the varactors VA1 and VA2, it can be corrected in each varactor by the capacity value control circuit 11. Hence, the precision of output signal fout may be further enhanced.

Specific examples of the capacity value control circuit 11 are shown in FIGS. 8 and 13, but the circuit configuration of the capacity value control circuit is not limited to these examples. The circuit configuration is not particularly specified as far as the input and output characteristics as shown in FIG. 6A, FIG. 10A, and FIG. 12A can be obtained.

The application of the capacity value control circuit 11 of the invention is not limited to the voltage control oscillation circuit alone. It can be applied to various circuits such as filter circuits in which control of capacity value is required.

Control voltage VT is an example of first voltage, output voltage CNTOUT is an example of second voltage, the capacity value control circuit 11 is an example of a second voltage control circuit, and varactors VA1 and VA2 are examples of variable capacity elements.

According to the variable capacity circuit and control method of the variable capacity circuit of the invention, the variable width of terminal voltage can be extended without increasing the element area of varactor, or raising or lowering the supply voltage, and the variable capacity width of capacity value can be also expanded even in the environment of low supply voltage, and hence the linear area in terminal voltage—capacity value characteristic can be utilized effectively.

What is claimed is:

1. A variable capacity circuit comprising:
   a second voltage control circuit for receiving a first voltage and issuing a second voltage, wherein a voltage level of the second voltage changes depending on a voltage level change of the first voltage; and
   at least one variable capacity element for receiving the first voltage at one end and the second voltage at other end, and controlling a capacity value depending on a differential voltage between the first voltage and the second voltage.

2. The variable capacity circuit according to claim 1, wherein the second voltage control circuit adjusts the second voltage variably so that the second voltage has a negative correlation to the first voltage.

3. The variable capacity circuit according to claim 1, wherein the second voltage control circuit adjusts the second voltage variably so that the second voltage has a positive correlation to the first voltage.

4. A voltage control oscillation circuit comprising:
   a variable capacity control circuit comprising:
      a second voltage control circuit for receiving a first voltage and issuing a second voltage, wherein a voltage level of the second voltage changes depending on a voltage level change of the first voltage, and
      at least one variable capacity element for receiving the first voltage at one end and the second voltage at other end, and controlling a capacity value depending on a differential voltage between the first voltage and the second voltage;
   an inductor connected to the variable capacity element of the variable capacity circuit; and
   a capacitor for connection provided on a connection route of the variable capacity element and the inductor.

5. The voltage control oscillation circuit according to claim 4, wherein a resistance element is provided on a connection route of output terminal of the second voltage control circuit and the variable capacity element.

6. A control method of variable capacity circuit comprising the steps of:
   issuing a second voltage, wherein a voltage level of the second voltage changes depending on a voltage level change of the first voltage, and
   controlling a capacity value of a variable capacity element depending on a differential voltage between the first voltage and the second voltage.

7. The control method of variable capacity circuit according to claim 6, wherein the second voltage is adjusted variably so that the second voltage has a negative correlation to the first voltage.

8. The control method of variable capacity circuit according to claim 7, wherein, for increasing the change rate of a capacity value of the variable capacity element relative to the first voltage, a decrease rate of the second voltage relative to the first voltage is increased depending on the change rate, and
   for decreasing the change rate of the capacity value of the variable capacity element relative to the first voltage, the decrease rate of the second voltage relative to the first voltage is decreased depending on the change rate.

9. The control method of variable capacity circuit according to claim 6, wherein the second voltage is adjusted variably so that the second voltage has a positive correlation to the first voltage.

10. The control method of variable capacity circuit according to claim 9, wherein, for decreasing the change rate of a capacity value of the variable capacity element relative to the first voltage, an increase rate of the second voltage relative to the first voltage is increased depending on the change rate, and
    for increasing the change rate of the capacity value of the variable capacity element relative to the first voltage, the increase rate of the second voltage relative to the first voltage is decreased depending on the change rate.

11. The control method of variable capacity circuit according to claim 6, wherein the second voltage is provided with an offset depending on the difference between a center value in a range of differential voltage depending on a target capacity range of the variable capacity element, and a center value in a range of differential voltage determined by the first voltage and the second voltage.

* * * * *